US 6,694,594 B2

(12) United States Patent
Chung et al.

(10) Patent No.: US 6,694,594 B2
(45) Date of Patent: Feb. 24, 2004

(54) METHOD FOR FABRICATING A THIN METAL SHELL HAVING CONNECTING COMPONENTS

(75) Inventors: Chi-Keung Chung, Hsinchu (TW); Tzu-Chen Kuo, Kaohsiung (TW)

(73) Assignee: Metal Industries Research & Development Center, Koahsiung (TW)

( * ) Notice: Subject to any disclaimer, the term of this patent is extended or adjusted under 35 U.S.C. 154(b) by 132 days.

(21) Appl. No.: 09/736,199

(22) Filed: Dec. 15, 2000

(65) Prior Publication Data

US 2001/0015005 A1 Aug. 23, 2001

(30) Foreign Application Priority Data

Jan. 28, 2000 (TW) ........................................ 89101594 A

(51) Int. Cl.⁷ .............................................. B21D 35/00
(52) U.S. Cl. ...................................... 29/469.5; 29/421.1
(58) Field of Search ............................. 29/469.5, 421.1, 29/17.1, 17.3; 174/52.5, 59

(56) References Cited

U.S. PATENT DOCUMENTS

| | | | | | |
|---|---|---|---|---|---|
| 2,545,898 | A | * | 3/1951 | Schmitt ........................ 174/59 |
| 3,733,881 | A | * | 5/1973 | Grigorenko .................. 72/349 |
| 4,309,888 | A | * | 1/1982 | Miller et al. .................. 72/334 |
| 4,821,546 | A | * | 4/1989 | Story ............................. 72/60 |
| 4,901,552 | A | * | 2/1990 | Ginty et al. .................... 72/60 |
| 5,118,903 | A | * | 6/1992 | Schupp et al. ............. 174/16.3 |
| 5,237,486 | A | | 8/1993 | LaPointe et al. |
| 5,301,132 | A | * | 4/1994 | Akahane ...................... 361/681 |
| 5,449,109 | A | * | 9/1995 | Chuang et al. ............. 228/157 |
| 5,552,967 | A | * | 9/1996 | Seto et al. ................... 361/818 |
| 5,715,139 | A | * | 2/1998 | Nakajima ................... 361/683 |
| 5,747,737 | A | * | 5/1998 | Waehner ...................... 174/59 |
| 5,889,738 | A | * | 3/1999 | Huter ......................... 368/220 |
| 5,974,847 | A | * | 11/1999 | Saunders et al. ............... 72/57 |
| 6,064,448 | A | * | 5/2000 | Feng ......................... 348/707 |
| 6,097,339 | A | * | 8/2000 | Filipovic et al. ............ 343/702 |
| 6,186,838 | B1 | * | 2/2001 | Foster ......................... 439/797 |
| 6,202,276 | B1 | * | 3/2001 | Chuang .................... 29/421.1 |
| 6,215,454 | B1 | * | 4/2001 | Tran .......................... 343/841 |
| 6,285,327 | B1 | * | 9/2001 | See ............................ 343/702 |

FOREIGN PATENT DOCUMENTS

| | | | | |
|---|---|---|---|---|
| GB | 2205624 | * | 12/1988 | ............ F16B/5/07 |
| WO | WO 99/05380 | * | 2/1999 | |

* cited by examiner

Primary Examiner—Gregory Vidovich
Assistant Examiner—Essama Omgba
(74) Attorney, Agent, or Firm—Lowe Hauptman Gilman & Berner LLP

(57) ABSTRACT

A method for fabricating a thin metal shell that has connecting components is disclosed. This method comprises the following steps: forming a metal plate by plastic forming technologies into a thin shell with a plurality of bonding bases thereon; applying a structure adhesive on the bonding bases; disposing connecting components on the bonding bases with the structural adhesive; and curing the structural adhesive which bonds the shell and connecting components.

24 Claims, 4 Drawing Sheets

METHOD FOR FABRICATING A THIN METAL SHELL HAVING CONNECTING COMPONENTS

BACKGROUND

1. Field of the Invention

The present invention generally relates to a method for fabricating a thin metal shell, and more particularly to a method for fabricating a thin metal shell having connecting components.

2. Description of the Prior Art

As the trends in household appliance, consumer electronics, computers and peripheral equipment move towards much lighter, thinner, shorter and smaller requirements, particularly the requirements for the portable products, are even stringent. Therefore, it strongly requires to use much lighter materials for the structural components (like frame, shield and partition plate) of the products in order to meet these requirements. Hence, in the early stage manufacturers of fabricating household appliance, consumer electronics, computers, and peripheral equipment utilize the plastic injection molding to fabricate the shell massively. They also dispose the mortise, tenon, slot, positioning pin/hole, reinforced rib, partition wall and sinking or bulge match components to rapidly connect, position and decrease the usage of the screws and action of screwing during the assembly process. However, plastic materials have the problems of low structural strength. These materials are easily fractured and scratched upon external impact and the decrease in size for the screw hole bases or the positioning pins is limited, otherwise they are easily fractured and broken. In addition, the plastic component has an electromagnetic interference (EMI) problem and thus the surface of the plastic component must do certain treatment to prevent EMI. This treatment will increase the cost of manufacturing.

Recently, applications of light metals have been tremendously increased to replace the plastic materials for manufacturing the shell components. These light materials used for manufacturing the shell components, such as magnesium (Mg) alloy, aluminum (Al) alloy and Titanium (Ti) alloy, have a high structural strength and can be made very thin. In addition, these alloys provide a better EMI protection and can be recycled. For example, U.S. Pat. No. 5,237,486 entitled "Structure Frame for Portable Computer" issued to LaPointe et. al. on Aug. 17, 1993 discloses a lightweight die-cast magnesium (Mg) alloy frame of the portable computer with the advantages of high structural strength, thinness, EMI protection. However, the technology of die casting or thixomolding for fabricating the thin shell components utilized in the U.S. Pat. No. 5,237,486 and in the current industry has a weakness of low yield rate. The yield rate is less than 60% and the thickness of A4 size shell cannot be less than 1 mm. Besides, the surface of the thin shell components by the die casting method usually has pores, voids or cracks. These imperfections need to be reworked by filling and multiple layer surface treatment so as to obtain delicate appearance. So, the cost will be very high.

Except the die casting method, manufacturers try to use the forging method to fabricate the thin metal shell components. This method has been successfully applied to thin metal shell components with small size, such as the shield of MD case (80×80 mm). However, there still exists technical difficulty for making large size thin metal shell components. In addition, no matter the thin metal shell components made by either the die casting or the forging method, the components need further mechanical machining (such as milling and tapping) to form connecting components thereon, which significantly increases the cost of manufacturing. Besides, flammable metals (like Mg alloy) are liable to burn during the processes of melting and refining, and mechanical machining. It will increase the danger during the manufacturing process.

In views of the disadvantages of low yield rate, limited size for thin metal shell components and danger during the manufacturing process according to the above-mentioned methods, there is a need to develop a new method for manufacturing the thin metal shell in order to overcome the above-mentioned disadvantages.

SUMMARY OF THE INVENTION

An object of the invention is to provide a method for fabricating the thin metal shell having connecting components, in which the present method can tremendously decrease the technical difficulty of fabricating the thin metal shell and make the subsequent surface treatment or coating processes become much easier, thereby decreasing the manufacturing cost.

Another object of the invention is to provide a method for fabricating the thin metal shell having connecting components, which utilizes the bonding technology to bond components tightly and does not need additional mechanical machining.

Another object of the invention is to provide a method for fabricating the thin metal shell having connecting components, in which the present method can get rid of the danger of using flammable alloys during the process of melting, refining, and mechanical machining, thereby improving the safety during manufacturing process.

Another object of the invention is to provide a method for fabricating the thin metal shell having connecting components, in which the connecting components such as outer screws or barbs, inner slots which are difficult to be formed by current manufacturing methods.

Another object of the invention is to provide a method for fabricating the thin metal shell having connecting components for producing much larger and thinner metal shell.

Another object of the invention is to provide a method for fabricating the thin metal shell having connecting components for improving the yield rate and quality stability of metal shell so as to decrease the manufacturing cost.

According to the present invention, a metal plate is firstly formed into a thin shell by plastic forming technology, and a plurality of connecting bases are also formed on the surface of the shell component; structure adhesives are applied to the connecting bases; connecting components are disposed on the connecting bases for positioning and connecting; finally, the structure adhesives which are used to bond the shell and connecting components are cured in order to bond those components. The technologies of plastic forming suitable for the present invention include, but not limited to, stamping, forging, drawing, extruding, progressive cold forming or superplastic forming process. The metals appropriate for this method include ferrous metals such as galvanized sheet iron and stainless steel plate; nonferrous metals such as copper (Cu) alloy, aluminum (Al) alloy, magnesium (Mg) alloy, titanium (Ti) alloy, zinc (Zn) alloy, nickel (Ni), tin (Sn), aluminum-lithium (Al—Li) alloy or superalloys composed thereof.

According to the present invention, the methods of bonding the connecting components to the thin metal shell include spot welding, laser welding, resistance welding or ultrasonic welding.

BRIEF DESCRIPTION OF DRAWINGS

Other objects, aspects and advantages will become apparent from the following description of embodiments with reference to the accompanying drawings in which.

DETAILED DESCRIPTION OF THE PREFERRED EMBODIMENTS

Figure 1:
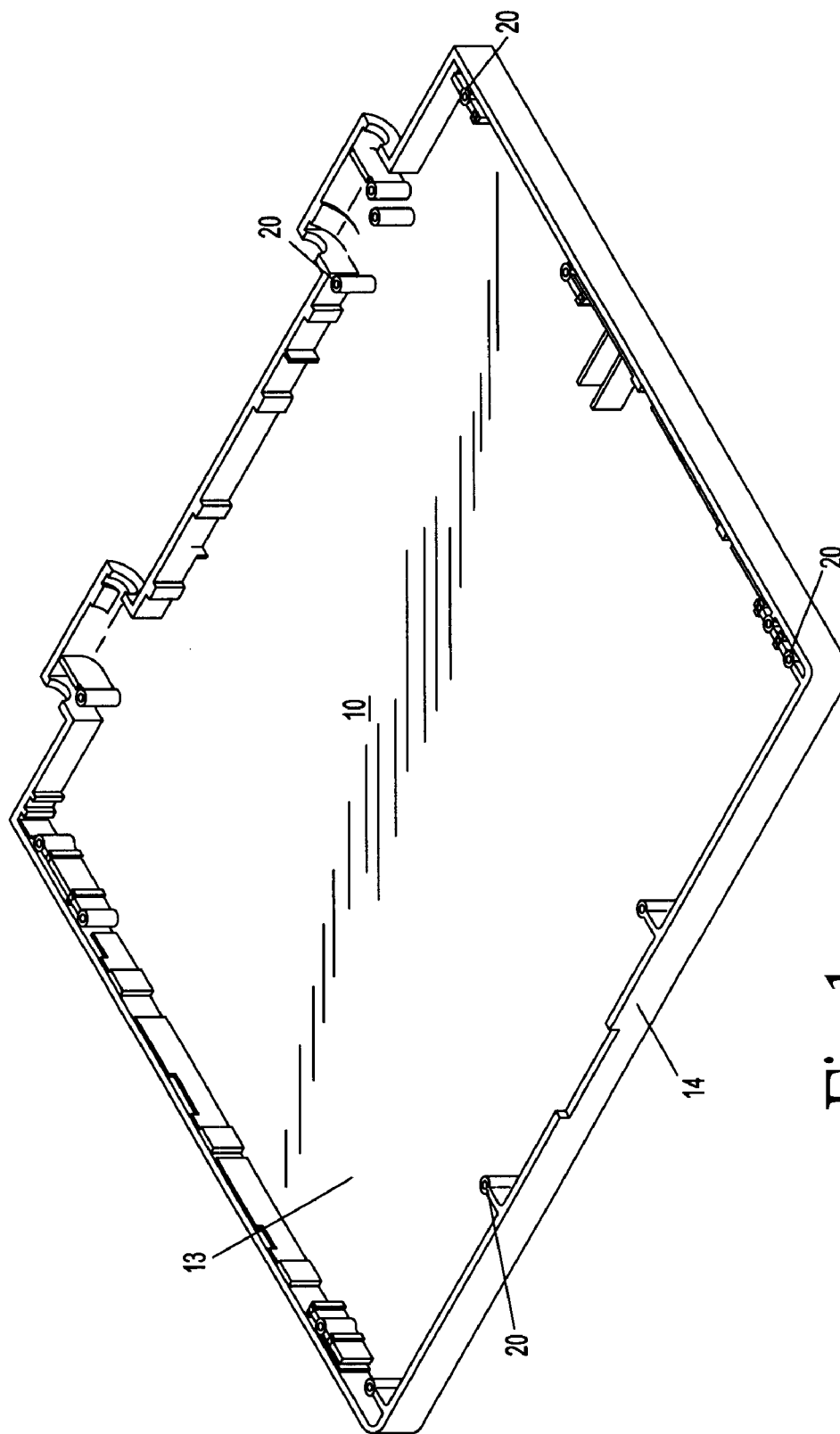
FIG. 1 is a perspective view of a thin metal shell according to the first preferred embodiment of this invention.
Figure 2:
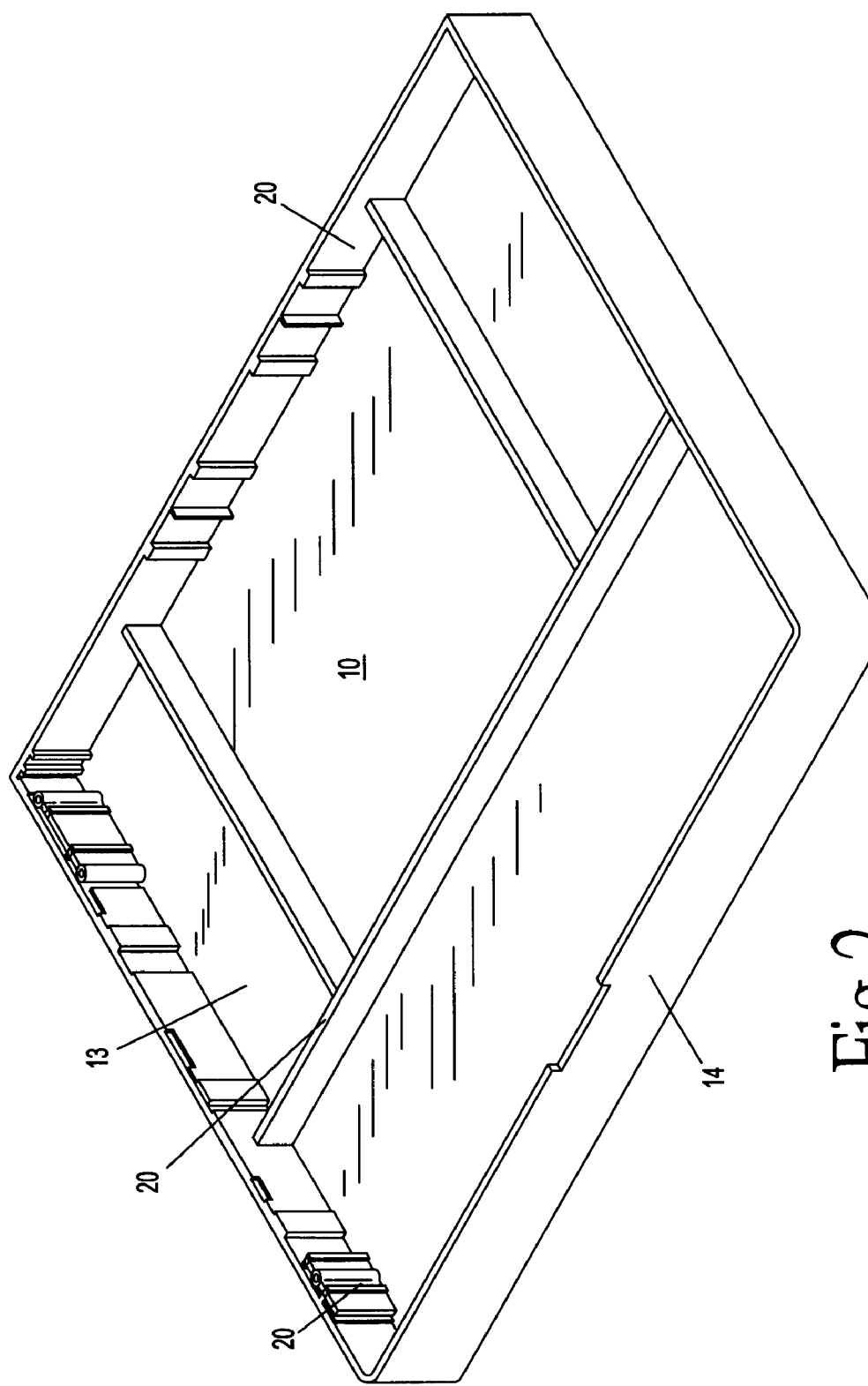
FIG. 2 is a perspective view of a thin metal shell according to another preferred embodiment of this invention.

This invention now will become apparent from the following preferred embodiments with reference to the accompanying drawings. In the accompanying drawings, the same reference numeral designates the same element. First, referring to FIGS. 1 and 2, the thin metal shell 10 is formed as a thin cover as shown in FIG. 1 or formed as a shell as shown in FIG. 2 by plastic forming technology. The thin metal shell 10 includes a main plate 13 and side plates 14 which surround the main plate 13. The plastic forming techniques suitable for this invention include stamping, forging, drawing, extruding, progressive cold forming or superplastic forming process. The metals appropriate for this method include ferrous metals such as galvanized sheet iron and stainless steel plate; and nonferrous metals such as copper (Cu) alloy, aluminum (Al) alloy, magnesium (Mg) alloy, titanium (Ti) alloy, zinc (Zn) alloy, nickel (Ni), tin (Sn), aluminum-lithium (Al—Li) alloy, or superalloys. The shape of the raw metal prefers to be a plate of uniform or non-uniform material. The material can be forged, progressive cold formed to form the convex base 11 or concave base 12 (4a–4d). According to the methods of this invention, the thin metal shell 10 is formed by stamping, forging, drawing, extruding or progressive cold forming and the thickness of the metal shell 10 formed by these methods is much smaller than that made by the die casting method. For example, the minimal thickness of the thin metal shell is 1 mm for the Mg or Al alloy formed by the current die casting method; but the minimal thickness of the thin metal shell 10 can be less than 0.3 mm for the galvanized sheet iron or stainless steel plate formed by the plastic forming technology in this invention. For the aluminum (Al) plate, the minimal thickness can be less than 0.5 mm. According to the invention, the surface of the thin metal shell 10 formed by plastic forming is rather smooth and thus the post-treatment become much easier. There is no need to do filling on the surface of the thin metal shell 10 and delicate appearance thereon can be obtained upon finishing. The plastic forming technology of this invention can be used to form the thin metal shell 10 of larger size, but the cost of the equipment and mold is less expensive in comparison with the die casting method. In addition, the scrap produced by the plastic forming technology is less than that produced by the die casting method, thereby decreasing the cost of materials.

Figure 3A:
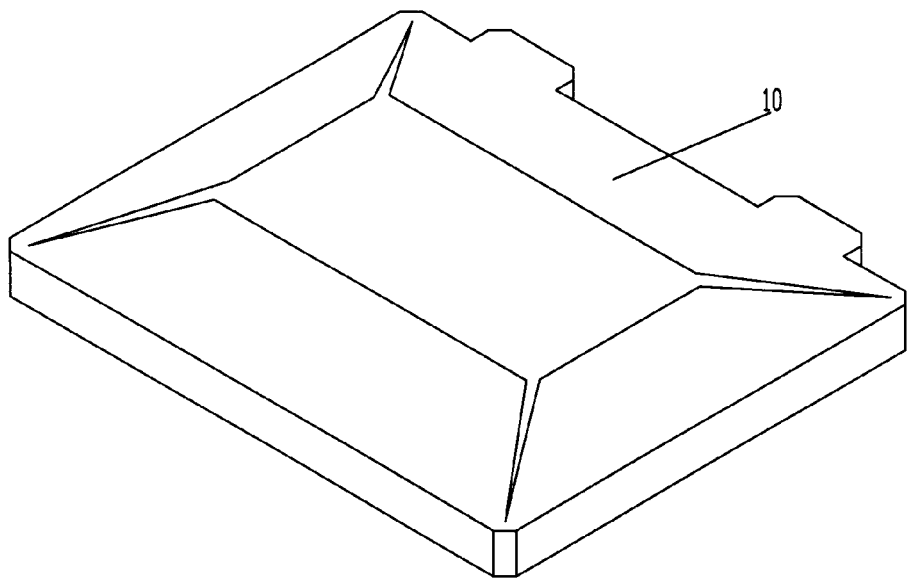
FIGS. 3a–3b are perspective views of the reinforced thin metal shells according to the preferred embodiment of this invention.
Figure 3B:
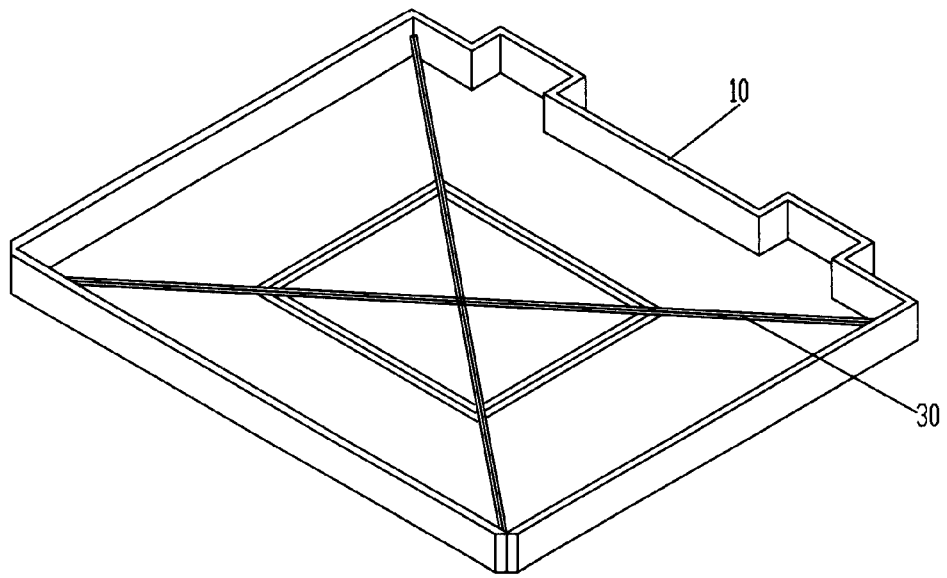

As shown in FIG. 3a, when the thin metal shell 10 is used as a cover, a proper bulging or sinking contour according to the layout can be plastic formed on the surface so as to increase the strength of the thin metal shell 10. As shown in FIG. 3b, reinforced ribs 30 can be added in the main plate 13 of the thin metal shell 10 in order to increase the mechanical strength of the thin metal shell 10. Based on the requirements, the reinforced ribs 30 can be in the form of bars, inverse T, V, or U type at the proper place to improve the mechanical strength of the thin metal shell 10. Preferably, the reinforced ribs 30 is made of the same material with the metal shell 10 or of the fiber reinforced composite. Then the reinforced ribs 30 are adhered with the main plate 13 of the metal shell 10 by means of the structural adhesives.

As shown in FIGS. 4a–4g, the connecting components 20 might be cylinder shape connecting components including outer screw pillar, inner screw pillar, positioning pin, or plate shape connecting components including press fit pin, fastener, slot, rib, partition plate. All the connecting components 20 should be pre-machined and finished without further machining. For example, the outer thread of the outer screw pillar or the tapping of the inner screw pillar should be made in advance, then these pillars are adhered on the convex base 11 or the concave base 12 of the thin metal shell 10 via adhesives or melting method. In this way, it can eliminate the subsequent mechanical machining processes including milling, drilling and tapping applied to the die castings. The barb or inner slot of a press fit pin, fastener, slot should be made in advance, then these components are adhered to the thin metal shell 10 via adhesives or melting method. Especially, magnesium (Mg) alloy has a tendency of burning during machining, therefore there must have a special technique or equipment to proceed the machining process. According to this invention, since all the connecting components can be machined and finished in advance, it can improve the safety during work.

According to the invention, the methods of bonding the thin metal shell 10 with the connecting components 20 include application of structural adhesives, spot welding, laser welding, resistance welding or ultrasonic welding. In the following description, we will elaborate these different methods of bonding the thin metal shell 10 with the connecting components 20.

Application of Structural Adhesives

Structural adhesives for the automobile, aerospace industries have been developed several years ago by Dow Chemical company. These structural adhesives are even stronger than the matrices that are adhered. Now, they have been applied in the automobile industry to decrease spot welding requirements. Besides, they can be applied to bond the thin metal shell 10 with connecting components 20 so as to provide enough mechanical strength to sustain stresses. The stresses mainly include the tensile stress happened on threaded components, fastener, press fit pin, etc. and compressive stress while the thin metal shell is impacted by external force, yet part of the stresses may include the bending or shearing stress happened on positioning pin, partition plate, positioning strip, etc. The structural adhesives have a better resistance to tensile stress than shear stress. However, the inferior shear stress can be overcome and improved by design skill. For instance, increasing the bonding area or transforming the shear stress into tensile stress can be used to ensure the bonding quality of the structural adhesive. In addition, combined with other mechanically aided ways of tensile resistance such as mixed use of structural adhesive and welding, and using close tolerance design can also have a reinforced effect.

The structural adhesives can be applied by utilizing the robot, automatic dispenser or surface-mount technology (SMT). There are several advantages of using robot or automatic dispenser to apply the structural adhesive. These advantages include accurate positioning and a better control of thickness and area of adhesives; however, the rate of application is relatively low. For SMT, the structural adhesive is applied to the thin metal shell through printing-like method at one time. This way is much quicker and can save time. The application of the structural adhesive can be processed in automation, while the thickness of the structural adhesive can be controlled by using certain sizes of glass beads. In the case that the thin metal shells are made of Mg alloy, Al alloy and Al—Li alloy with oxide residues on the surface, they should be cleaned or surface treated before the application of the structural adhesive in order to ensure the bonding strength.

Application of Spot Welding or Resistance Welding

In general, the method for connecting sheet material adopts the spot welding. As the size of the connecting components is usually small, especially the information electronics, therefore we can apply instantaneous heating within the bonding area by spot welding or resistance welding so as to reach the purpose of connection. The advantages of using spot welding or resistance welding include rapid and simple process as well as good bonding strength if the current is under appropriate control. However, this process is not applicable to thermo-sensitive materials, such as Mg alloy.

Application of Ultrasonic Welding

Completely differing from the methods mentioned above, the ultrasonic vibration can also be applied to the bonding area between the thin metal shell 10 and connecting components 20. The heat created by the surface friction during ultrasonic vibration is used to bond materials. This method has the advantages of good bonding performance, simple process, and no welding speck on the surface of the thin metal shell. However, this process is not applicable to thermo-sensitive material and the thin metal shell with an oxide layer.

Application of Laser Welding

Completely differing from the methods mentioned above, laser is applied to the bonding area between the thin metal shell 10 and connecting components 20. The instantaneous energy is created to bond materials. This method has the advantages of no welding speck, good appearance and low thermal deformation.

Ways to Put the Connecting Components on the Thin Metal Shell that has been Applied with the Structural Adhesive Automatic inserting machine or technology can be applied to align the connecting components 20 and to feed those components to the pick-up area, then a mechanical claw or arm can be applied to pick up those components, and to move those components to the right place for bonding. If the thin metal shell 10 has the above-mentioned convex base 11 or concave base 12, there will be a function of automatic guiding and positioning, which can decrease the stringency for accurate positioning and accelerate layout speed. Without special design for positioning as mentioned above, current positioning technologies such as X-Y table, linear motor, etc. can still reach the positioning requirements.

Figure 4A:
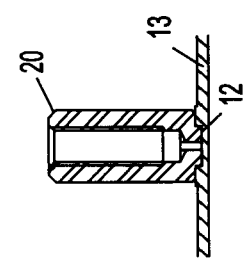
FIGS. 4a–4g are cross-section views of the thin metal shells with connecting components according to the preferred embodiment of this invention.
Figure 4B:
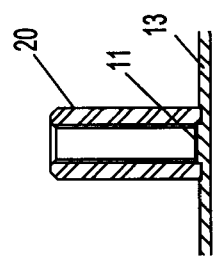
Figure 4C:
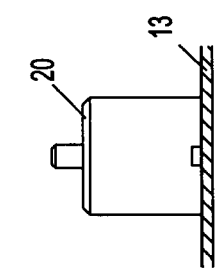
Figure 4D:
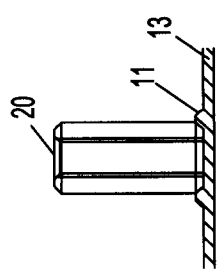
Figure 4G:
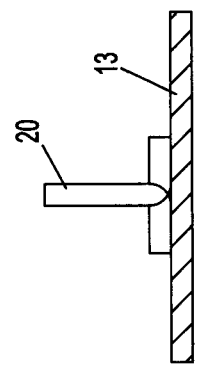
Figure 4F:
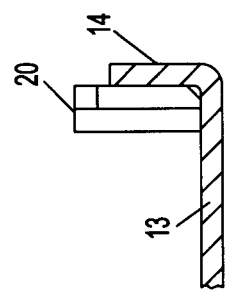
Figure 4E:
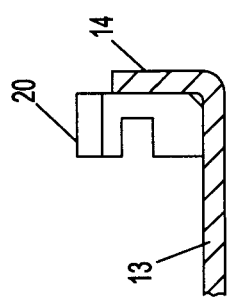

As shown in FIGS. 4e–4g, bonding on the folded side plate 14 of the thin metal shell 10 must be careful. In order to avoid moving and tilting of the connecting components 20 before curing of the structural adhesive, the following conditions have to be considered: 1. High viscosity adhesives. If the viscosity of the structural adhesive is high, it can prevent the connecting components from moving without external force and shipment. 2. Thermo-sensitive or temperature-sensitive adhesives. It is able to prevent the connecting components from moving or loosening if a bit of heat is added to partially harden the structural adhesive during bonding. In the case of the bonding between the folded side of the thin metal shell and the connecting components, spot welding, laser welding or ultrasonic welding can be applied for bonding without using structural adhesives. In case of the structural adhesive is applied, it has to be conductive material.

Curing Process

Curing process is the hardening process of the structural adhesive to create permanent structural strength. The components after assembly can be put into the curing oven to accelerate the hardening rate and hence decrease the processing time. If the materials of connecting components are thermo-sensitive or temperature-sensitive and cannot be baked in the oven, then the structural adhesive with higher hardening rate at room temperature will be required for alternative.

As apparent from the above description, the present invention provides a method for fabricating the thin metal shell having connecting components. This method can tremendously decrease the technical difficulty of fabricating the thin metal shell and make the subsequent surface treatment or coating become much easier, thereby lowering the manufacturing cost. For flammable alloys such as Mg alloy, the present invention can decrease the tendency of burning during melting, refining, and machining, therefore improve the safety during processing. Besides, the present invention can be used to fabricate the much larger and thinner metal shells.

Although the preferred embodiments of the invention have been disclosed for illustrative purposes, those skilled in the art will appreciate that various modifications, additions and substitutions are possible, without departing from the scope and spirit of the invention as set forth in the appended claims.

What is claimed is:

1. A method of fabricating a thin metal shell having connecting components, comprising the steps of:

forming a metal plate by plastic forming technologies into a thin shell with a plurality of bonding bases thereon;

applying a structural adhesive on the bonding bases;

disposing connecting components on the bonding bases with the structural adhesive; and curing the structural adhesive which bonds the shell and the connecting components;

wherein at least one of the connecting components is made of a material different from that of the metal plate, and the connecting components are selected from the group consisting of outer screw pillars, inner screw pillars, slots, positioning pins, press fit pins and fasteners as fitting components for connecting, positioning, quick locking/unlocking.

2. The method as claimed in claim 1, wherein the metal plate is made of a material selected from the group consisting of Fe, Cu, Al, Mg, Ni, Sn, Zn, Ti, stainless steel metals and alloys composed thereof.

3. The method as claimed in claim 2, wherein the thickness of the metal plate is less than 2 mm.

4. The method as claimed in claim 1, wherein the plastic forming technologies include stamping, forging, drawing, extruding, progressive cold forming or superplastic forming technology.

5. The method as claimed in claim 4, wherein the plastic forming technologies are selected from the group consisting of stamping, drawing, extruding, progressive cold forming or superplastic forming technology.

6. The method as claimed in claim 1, wherein the bonding base is concave.

7. The method as claimed in claim 1, wherein the bonding base is convex.

8. The method as claimed in claim 1, wherein the structural adhesive is applied by dispensing.

9. The method as claimed in claim 1, wherein the structural adhesive is applied by the surface-mount technology.

10. The method as claimed in claim 1, wherein the connecting components are disposed on the bonding bases applied with structural adhesives thereon by using automatic inserting technology.

11. The method as claimed in claim 1, wherein the curing step comprises baking the metal plate with the structural adhesive and connecting components disposed thereon in a curing oven.

12. The method as claimed in claim 1, wherein the curing step is conducted at the room temperature.

13. The method of claim 1, wherein the connecting components are pre-machined and pre-finished prior to said disposing and curing.

14. The method as claimed in claim 1, further comprising the steps of preparing a separate reinforcing bar; and bonding the reinforcing bar to the thin shell by the structural adhesive.

15. The method as claimed in claim 1, wherein the structural adhesive has a sufficiently high viscosity to prevent the connecting components disposed on the bonding bases from moving or tilting.

16. The method as claimed in claim 1, further comprising partially hardening the structural adhesive prior to said curing to prevent the connecting components disposed on the bonding bases from moving or tilting.

17. A method of fabricating a thin metal shell having connecting components, comprising the steps of:

forming a metal plate by plastic forming technologies into a thin shell with a plurality of bonding bases thereon;

disposing connecting components on the bonding bases; and bonding the shell and the connecting components;

wherein at least one of the connecting components is made of a material different from that of the metal plate, and the connecting components are selected from the group consisting of outer screw pillars, inner screw pillars, slots, positioning pins, press fit pins and fasteners as fitting components for connecting, positioning, quick locking/unlocking.

18. The method as claimed in claim 17, wherein the metal plate is made of a material selected from the group consisting of Fe, Cu, Al, Mg, Ni, Sn, Zn, Ti, stainless steel metals and alloys composed thereof.

19. The method as claimed in claim 17, wherein the thickness of the metal plate is less than 2 mm.

20. The method as claimed in claim 17, wherein the thin metal shell and the connecting components are bonded by structural adhesives.

21. The method as claimed in claim 17, wherein the thin metal shell and the connecting components are bonded by spot welding.

22. The method as claimed in claim 12, wherein the thin metal shell and the connecting components are bonded by laser welding.

23. The method as claimed in claim 17, wherein the thin metal shell and the connecting components are bonded by ultrasonic welding.

24. The method of claim 17, wherein the connecting components are pre-machined and pre-finished prior to said disposing and bonding.

* * * * *